(12) United States Patent
Hosono et al.

(10) Patent No.: US 6,620,557 B1
(45) Date of Patent: Sep. 16, 2003

(54) PHOTO-MASK, PHOTO-MASK PAIR, SEMICONDUCTOR DEVICE AND METHOD OF MANUFACTURING A SEMICONDUCTOR DEVICE

(75) Inventors: Kunihiro Hosono, Hyogo (JP); Masayoshi Mori, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 26 days.

(21) Appl. No.: 09/627,012

(22) Filed: Jul. 27, 2000

(30) Foreign Application Priority Data

Jan. 26, 2000 (JP) .......................... 2000-016830

(51) Int. Cl.⁷ ................................ G03F 9/00
(52) U.S. Cl. ............................................ 430/5
(58) Field of Search ..................... 430/5, 22, 30, 430/394

(56) References Cited

U.S. PATENT DOCUMENTS 5,900,349 A * 5/1999 Han .................. 430/311
6,042,972 A * 3/2000 Schulze ................ 430/5
6,114,072 A   9/2000 Narimatsu ............. 430/5
6,210,843 B1 * 4/2001 Chen et al. .............. 430/5

FOREIGN PATENT DOCUMENTS

| JP | 7-29815 | 1/1995 |
| JP | 7-297115 | 11/1995 |
| JP | 9-99547 | 4/1997 |
| TW | 382746 | 5/1998 |

* cited by examiner

Primary Examiner—Mark F. Huff
Assistant Examiner—Saleha R. Mohamedulla
(74) Attorney, Agent, or Firm—McDermott, Will & Emery

(57) ABSTRACT

A main object of the present invention is to provide a photo-mask improved to ensure dimension with high accuracy. An actual pattern is provided on a substrate. A monitor mark for ensuring dimension of the actual pattern is also provided on the substrate. The monitor mark is provided with a coarse pattern and a high-density array pattern formed to have a density higher than the coarse pattern.

15 Claims, 16 Drawing Sheets

EXAMPLE OF INTERCONNECTION TYPE
MONITOR MARK

EXAMPLE OF INTERCONNECTION TYPE
ELEMENT PATTERN
TOP: MEMORY CELL PORTION
BOTTOM: LOGIC PORTION

EXAMPLE OF HOLE TYPE MONITOR MARK

EXAMPLE OF HOLE TYPE ELEMENT PATTERN
TOP: MEMORY CELL PORTION
BOTTOM: LOGIC PORTION

EXAMPLE OF INTERCONNECTION TYPE
MONITOR MARK

EXAMPLE OF INTERCONNECTION TYPE
ELEMENT PATTERN
TOP: MEMORY CELL PORTION
BOTTOM: LOGIC PORTION

EXAMPLE OF HOLE TYPE MONITOR MARK

EXAMPLE OF HOLE TYPE ELEMENT PATTERN
TOP: MEMORY CELL PORTION
BOTTOM: LOGIC PORTION

EXAMPLE OF CROSS MARK FOR
REGISTRATION ACCURACY MEASUREMENT

PHOTO-MASK, PHOTO-MASK PAIR, SEMICONDUCTOR DEVICE AND METHOD OF MANUFACTURING A SEMICONDUCTOR DEVICE

BACKGROUND OF THE INVENTION

1. Field of the Invention

The present invention generally relates to a photo-mask and a photo-mask pair, and more particularly to a photo-mask and a photo-mask pair improved so as to enhance an ability of ensuring dimension accuracy. The present invention further relates to a semiconductor device formed to use such a photo-mask and to a method of manufacturing such a semiconductor device.

2. Description of the Background Art

FIGS. 21A to 21F illustrate a cross-sectional view showing a method of manufacturing a semiconductor device using a conventional photo-mask, in particular, a process of forming an etching pattern of $SiO_2$ film.

Referring to FIG. 21A, a $SiO_2$ film 52 is formed on a silicon substrate 51.

Referring to FIG. 21B, a photo-resist 53 is formed on $SiO_2$ film 52.

Referring to FIG. 21C, photo-resist 53 is selectively irradiated with UV rays using a photo-mask 54 to form a potential image in photo-resist 53.

Referring to FIG. 21D, photo-resist 53 is developed to form a resist pattern 55.

Referring to FIG. 21E, $SiO_2$ film 52 is etched using resist pattern 55 as a mask.

Referring to FIGS. 21E and 21F, photo-resist pattern 55 is removed so that a pattern 56 of the $SiO_2$ film remains on silicon semiconductor substrate 51.

FIG. 22 is a cross-sectional view of a photo-mask. Referring to FIG. 22, a light-shielding pattern 57 formed of a metal film, oxide, nitride, sulfide, or fluoride of Cr, Mo, Zr, Ta, W or the like and a compound thereof is provided on a glass substrate 58. Light-shielding pattern 57 has a film thickness of approximately 100 to approximately 170 nm. Such a photo-mask is provided, in addition to an actual pattern, with a monitor mark for ensuring the dimension of the actual pattern. The monitor mark is also formed of the metal film or the metal compound film described above.

FIG. 23 is a plan view of a conventional photo-mask.

A mask pattern region 2 is formed on a photo-mask 1. A semiconductor element chip region 3 is provided in mask pattern region 2. Memory cell region 3a (a high-density portion) is provided in semiconductor element chip region 3. Semiconductor element chip region 3 is provided with an element pattern 5 for a high-density portion (such as a memory cell) and an element pattern 6 for a low-density portion (such as a low-density logic portion). Monitor mark 4 is provided at each of the four corners of mask pattern region 2. Monitor mark 4 is also provided at a middle point of a long side of mask pattern region 2.

Examples of conventional monitor marks are shown in FIGS. 24A and 24B. FIG. 24A is an example of a monitor mark formed with interconnections (hereinafter referred to as "interconnection type"). FIG. 24B shows a typical interconnection type element pattern in the actual pattern. The interconnection type monitor mark shown in FIG. 24A is configured to ensure the dimension of the interconnection type element pattern shown in FIG. 24B. The arrows in FIGS. 24A and 24B point the position where the dimension is measured.

FIGS. 25A and 25B are plan views of conventional monitor marks formed with holes (hereinafter referred to as "hole type"). FIG. 25A shows an example of a hole type monitor mark and FIG. 25B shows a typical hole type element pattern in the actual pattern. The hole type monitor mark shown in FIG. 25A is for ensuring the dimension of the hole type element pattern shown in FIG. 25B.

FIG. 26 shows an example of a conventional cross mark for measuring registration accuracy.

In FIGS. 24A through 26, the portion designated by reference number 7 denotes an outer frame of the monitor mark and the portion designated by reference number 8 denotes a pattern region for which the element dimension is monitored. A cross pattern for registration accuracy measurement is designated by reference number 9.

Thus, the conventional monitor mark was formed to have a pattern shape of simple cross, line and space, rectangle or the like, which is simply designed to represent the pattern of the semiconductor element.

However, since a semiconductor element has been required to have improved function and performance, a system LSI in which a memory element and a logic element are mounted with high density has come to be designed along with size reduction of the pattern, thereby complicating the photo-mask used for manufacturing of these elements. In particular, the memory element pattern having higher density and smaller size and the logic element pattern having a large difference between coarse portion and dense portion of the pattern are arranged on the same photo-mask. Further, as a pattern is reduced in size, an error between the pattern dimension and the design dimension abruptly increases if the pattern has coarse and dense portions. Thus, it has been difficult for the simple pattern for monitoring dimension as shown in FIGS. 24A, 24B, 25A, 25B and 26 to represent the actual element pattern. It has therefore been difficult to ensure the photo-mask dimension with high accuracy. An example of the error is shown in Table 1.

TABLE 1

|  | LINE TYPE ($\mu$m) | | | HOLE TYPE - X/Y ($\mu$m) | | |
|---|---|---|---|---|---|---|
|  | Design value | Measured value | Error | Design value | Measured value | Error |
| Monitor mark | 1.20 | 1.21 | 0.01 | 1.20/1.20 | 1.21/1.21 | 0.01/−0.10 |
| Memory cell portion element pattern | 1.00 | 0.97 | −0.03 | 0.80/2.20 | 0.85/2.14 | 0.05/−0.06 |
| Logic portion element pattern | 1.40 | 1.37 | −0.03 | 1.50/1.50 | 1.55/1.55 | 0.05/0.05 |

In the conventional monitor mark, each element pattern was required to be individually measured in a process of manufacturing a photo-mask. However, such individual measurement of each element pattern takes too much effort, so that a method of making the mask with low cost and short delivery period has been desired.

SUMMARY OF THE INVENTION

The present invention is made to solve the problems described above, and an object of the invention is to provide a photo-mask improved to ensure the photo-mask dimension with high accuracy.

An another object of the invention is to provide photo-mask improved such that the photo-mask can be manufactured with low cost and short delivery period.

A further object of the invention is to provide a photo-mask pair, which enables efficient manufacturing of a semiconductor device.

A still further object of the invention is to provide a semiconductor device manufactured using such a photo-mask.

Another object of the invention is to provide a method of manufacturing the semiconductor device using such a photo-mask.

The photo-mask according to the first aspect includes a substrate. The substrate is provided with an actual pattern thereon. A monitor mark for ensuring the dimension of the actual pattern is provided on the substrate. The monitor mark is provided with a coarse pattern and a high-density pattern formed to have a density higher than the coarse pattern.

According to the invention, the monitor mark is provided with the coarse pattern and the high-density pattern formed to have a density higher than the coarse pattern, so that the dimension of the coarse portion of the actual pattern can be ensured and the dimension of the high-density portion of the actual pattern can also be ensured.

In the photo-mask according to the second aspect, the monitor mark is further provided with a cross pattern for registration accuracy measurement having a pair of arms crossing each other.

According to the invention, even the registration accuracy can be ensured. In the photo-mask according to the third aspect, the coarse pattern and the high-density pattern are each provided remote from a scanning region of the cross pattern.

According to the invention, the coarse pattern and the high-density pattern will not interrupt the scanning of the cross pattern.

In the photo-mask according to the fourth aspect, the monitor mark includes an outer frame pattern enclosing the coarse pattern and the high-density pattern. The outer frame pattern is formed wide enough to be visually recognizable through a microscope.

According to the invention, the existence of the monitor mark can be visually recognized through the microscope.

In the photo-mask according to the fifth aspect, a first dummy pattern having the same density as the coarse pattern is provided in the vicinity of the coarse pattern. A second dummy pattern having the same density as the high-density pattern is provided in the vicinity of the high-density pattern.

In the photo-mask according to the invention, the dummy patterns each having the same density as the high-density pattern or the coarse pattern are provided in the vicinity of the respective patterns, so that light can be evenly received at the time of exposure.

In the photo-mask according to the sixth aspect, a special-use pattern for a special use is provided in the vicinity of each of the high-density pattern and the coarse pattern.

In the photo-mask according to the invention, the special-use pattern is provided so that it can be utilized for a special use.

In the photo-mask according to the seventh aspect, the coarse pattern is formed as a single-line pattern, and the single-line pattern is at the same time the arm portion of the cross pattern.

According to the present invention, the area of the mask can effectively be utilized.

The photo-mask according to the eighth aspect includes a substrate. An actual pattern including a hole pattern is provided on the substrate. A monitor mark for ensuring the dimension of the hole pattern is also provided on the substrate. The monitor mark is provided with a cross pattern having a pair of arms crossing each other, a hole pattern ensuring pattern for ensuring the dimension of the hole pattern arranged remote from the scanning region of the cross pattern, and an outer frame pattern enclosing the cross pattern and the hole pattern ensuring pattern. The outer frame pattern is divided into multiple portions to avoid an over exposure. The arm portion of the cross pattern is also divided into multiple portions to avoid the over exposure.

According to the invention, the outer frame pattern is divided into multiple portions so as to avoid the over exposure. The arm portion of the cross pattern is also divided into multiple portions, so that the over exposure can be avoided.

The invention according to the ninth aspect involves a photo-mask pair including a first photo-mask used in a first step and a second photo-mask used in a second step subsequent to the first step. The first photo-mask includes a first substrate, a first actual pattern provided on the first substrate, and a first monitor mark provided on the first substrate for ensuring the dimension of the first actual pattern. The first monitor mark is provided with a first pattern for monitoring which represents the first actual pattern. The second photo-mask includes a second substrate, a second actual pattern provided on the second substrate, and a second monitor mark provided on the second substrate for ensuring the dimension of the second actual pattern. The second monitor mark is provided with a second pattern for monitoring which represents the second actual pattern. When the first photo-mask is used in the first step and the second photo-mask is used in the second step, the first pattern is provided in the first monitor mark and the second pattern is provided in the second monitor mark to avoid overlapping of the first and second patterns. The invention eliminates the generation of dust.

The invention according to the tenth aspect involves a photo-mask pair including a first photo-mask used in a first step and a second photo-mask used in a second step subsequent to the first step. The first photo-mask includes a first substrate, a first actual pattern provided on the first substrate, and a first-monitor mark provided on the first substrate to ensure the first actual pattern. The first monitor mark includes a first monitor pattern representing the first actual pattern. The second photo-mask includes a second substrate, a second actual pattern provided on the second substrate, and a second monitor mark provided on the second substrate to ensure the dimension of the second actual pattern. The second monitor mark includes a light-shielding pattern provided at a position where the first pattern can be entirely covered when the first photo-mask is used in the first step and the second photo-mask is used in the second step. The invention can eliminate the generation of dust.

The invention according to the eleventh aspect involves in a photo-mask pair including a first photo-mask used in a first step and a second photo-mask used in a second step subsequent to the first step. The first photo-mask includes a first substrate, a first actual pattern provided on the first substrate, and a first monitor mark provided on the first substrate to ensure the dimension of the first actual pattern. The first monitor mark includes a first cross pattern having a pair of arms crossing each other, and a first frame pattern provided to enclose the first cross pattern. The second photo-mask includes a second substrate, a second actual pattern, and a first monitor mark provided on the second substrate to ensure the dimension of the first actual pattern. The second monitor mark is provided with a second cross pattern having a pair of arms crossing each other in the cross shaped manner and a second frame pattern provided to enclose the second cross pattern. When the first photo-mask is used in the first step and the second photo-mask is used in the second step, the position and the width of the arms of the first cross pattern are selected such that one of the first and second arms entirely covers the other. The invention eliminates the generation of dust.

The photo-mask according to the twelfth aspect includes a substrate. A rectangular semiconductor element chip region in which a pattern of the semiconductor element is formed is provided on the substrate. A plurality of monitor marks for ensuring the dimension of the semiconductor element pattern are provided on the substrate and within the semiconductor device chip region. The plurality of monitor marks are provided at the four corners of the rectangular chip, at around the middle of two long sides of the rectangular chip, and at a position near the center of the rectangular chip, respectively. The invention eliminates the need for measuring the actual element pattern.

In a method of manufacturing a semiconductor device according to the thirteenth aspect, a photo-mask is first prepared including a substrate, an actual pattern provided on the substrate, and a monitor mark ensuring the dimension of the actual pattern, the monitor mark being provided with a coarse pattern and a high-density pattern formed to have a density higher than the coarse pattern. A semiconductor substrate is then prepared. A resist is formed on the semiconductor substrate. Thereafter, the photo-mask is used as a mask to expose the resist. The resist is then developed to form a resist pattern. The resist pattern is used to etch the semiconductor substrate. According to the invention, a highly reliable semiconductor device can be attained.

The invention according to the fourteenth aspect relates to a semiconductor device formed by at least steps (a) through (f) in the following:
(a) a step of preparing a photo-mask including a substrate, an actual pattern provided on the substrate, and a monitor mark for ensuring the dimension of the actual pattern, the monitor mark being provided with a coarse pattern and a high-density pattern having a density higher than the coarse pattern,
(b) a step of preparing a semiconductor substrate,
(c) a step of forming a resist on the semiconductor substrate,
(d) a step of using the photo-mask as a mask to expose the resist,
(e) a step of developing the resist to form a resist pattern, and
(f) a step of using the resist pattern to etch the semiconductor substrate.

According to the invention, a highly reliable semiconductor device can be attained.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention will be described below with reference to the drawings.

First Embodiment

Figure 1:
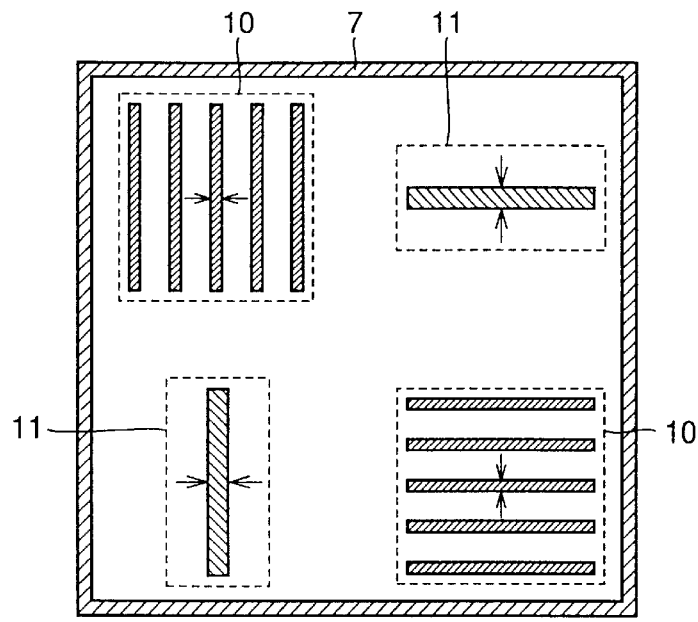
FIG. 1 is a plan view of a monitor mark of the first embodiment.
Figure 2:
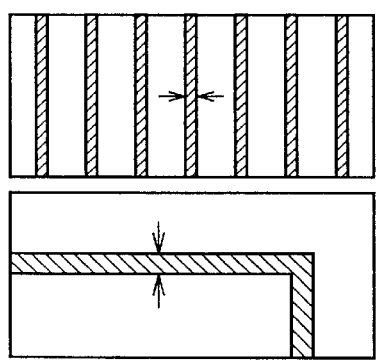
FIG. 2 is a plan view of a representative line-type element pattern of an actual pattern, corresponding to the monitor mark of the first embodiment.

FIG. 1 is a plan view of monitor marks according to the first embodiment. FIG. 2 is a representative example of an actual pattern formed within a photo-mask, showing an example of a line-type element pattern. The top part of FIG. 2 is a memory cell portion and the bottom part of FIG. 2 is a logic portion. FIG. 1 is a line-type monitor mark formed to correspond to and hence represent the actual pattern of FIG. 2. Arranged in the line-type monitor mark are a high-density array pattern 10 corresponding to a memory cell (M/C) or the like and an isolated pattern (or a coarse pattern) 11 representing a low-density (coarse) pattern region such as the logic portion. High-density array pattern 10 ensures the dimension of the memory cell portion and isolation pattern 11 ensures the element dimension of the logic portion. High-density array pattern 10 may be formed within the monitor mark by cutting out the M/C pattern array. In the drawings, the portion where the element dimension is to be measured is pointed by arrows.

The use of the monitor mark shown in FIG. 1 allows at least two types of array patterns to be accurately monitored, since two pattern types, i.e. high-density array pattern 10 and isolation pattern 11, are provided. The most frequently used patterns among the actual patterns are selected as high-density array pattern 10 and isolation pattern 11.

By using the monitor mark according to the embodiment, the accuracy guarantee of the actual element pattern is enhanced, thereby eliminating the need for measuring the dimension of the actual pattern. The result is shown in Table 2.

Second Embodiment

Figure 5:
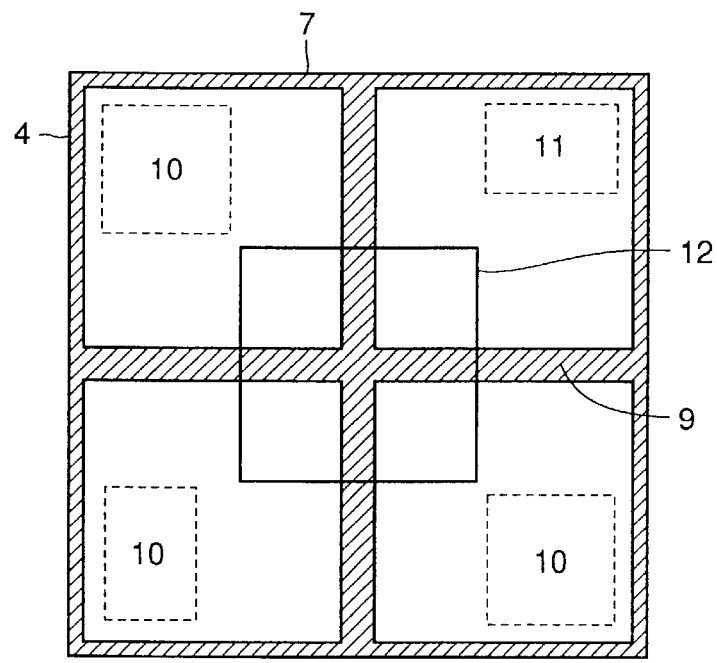
FIG. 5 is a plan view of a monitor mark of the second embodiment.

FIG. 5 is a plan view of a monitor mark according to the second embodiment. The monitor mark is provided with a cross pattern 9 having a pair of arms for registration accuracy measurement, crossing each other. A high-density array pattern 10 and an isolated pattern 11 as shown in FIG. 1 are provided in the portion excluding a scanning region 12 of cross pattern 9. The patterns are not illustrated for clarity reasons. For measuring the registration accuracy, the arm portion of cross pattern 9 is scanned by inspection beam to detect the pattern edge for each arm, and the center position of cross pattern 9 is calculated. High density monitor pattern 10 and isolated pattern 11 are formed in a portion remote from scanning region 12, so that high-density monitor pattern 10 and isolated pattern 11 would not interrupt the scanning of the inspection beam. Therefore, the accuracy of the registration measurement will be enhanced.

Furthermore, since the element dimension monitor marks (10, 11) and registration accuracy measurement mark 9 are all arranged in the same monitor mark, the area on the photo-mask can effectively be utilized.

Third Embodiment

Figure 6:
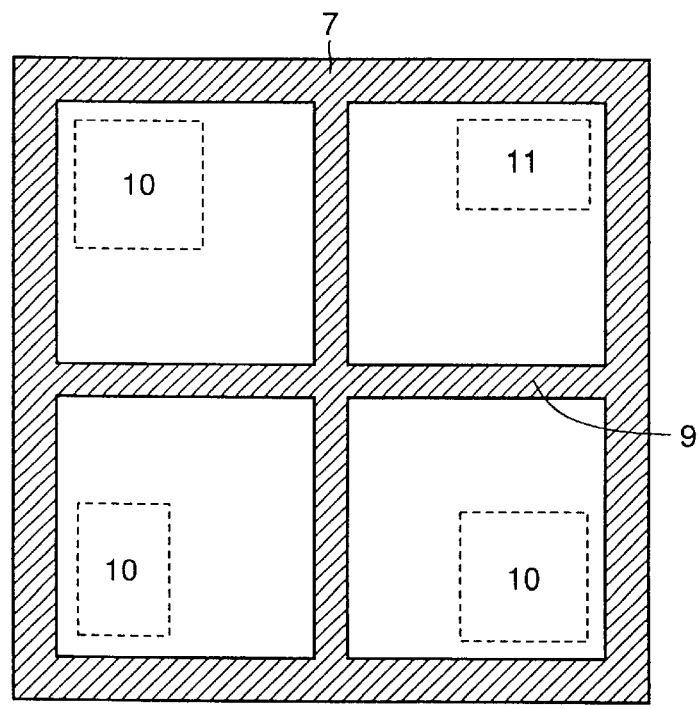
FIG. 6 is a plan view of a monitor mark of the third embodiment.

FIG. 6 is a plan view of the monitor mark according to the third embodiment. The monitor mark shown in FIG. 6 is the same as the monitor mark shown in FIG. 5 except for an aspect described below, so that the same or corresponding portion is denoted by the same reference number and the description thereof will not be repeated.

The difference between the monitor mark shown in FIG. 6 and the one shown in FIG. 5 is that outer frame pattern 7

TABLE 2

| | LINE TYPE ($\mu$m) | | | HOLE TYPE - X/Y ($\mu$m) | | |
|---|---|---|---|---|---|---|
| | Design value | Measured value | Error | Design value | Measured value | Error |
| Monitor mark (array portion) | 1.00 | 1.00 | 0.00 | 0.80/2.20 | 0.81/2.10 | 0.01/−0.10 |
| Monitor mark (isolated portion) | 1.40 | 1.41 | 0.01 | 1.50/1.50 | 1.50/1.50 | 0.00/0.00 |
| Memory cell portion element pattern | 1.00 | 1.01 | 0.01 | 0.80/2.20 | 0.81/2.11 | 0.01/−0.09 |
| Logic portion element pattern | 4.10 | 1.41 | 0.01 | 1.50/1.50 | 1.51/1.51 | 0.01/0.01 |

According to the present invention, a manufacturing process can be standardized and also simplified. In particular, since the manufacturing process using the mask is simplified in an item such as a system LSI for which a large item small volume production is performed, the cost can be reduced and also the delivery period can be shortened. Further, a monitor pattern region can effectively be utilized because the coarse and high-density patterns are both arranged in the same monitor mark.

Figure 3:
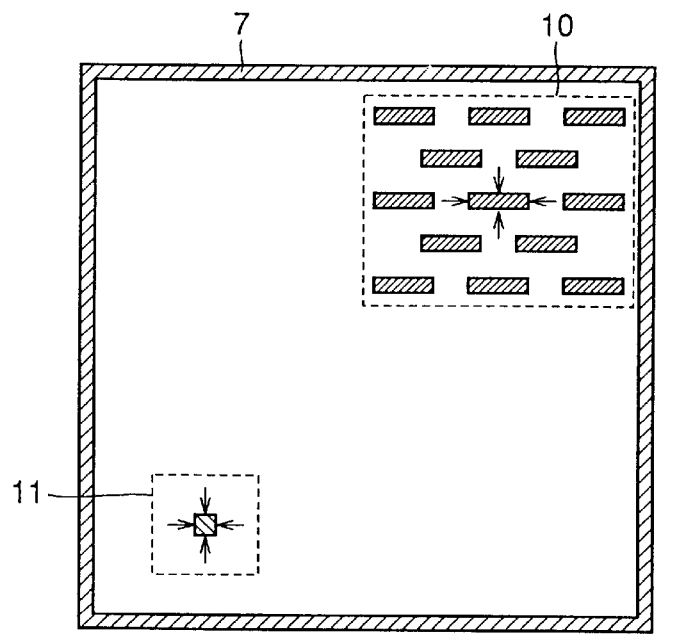
FIG. 3 is a plan view of a variation of the monitor mark of the first embodiment.
Figure 4:
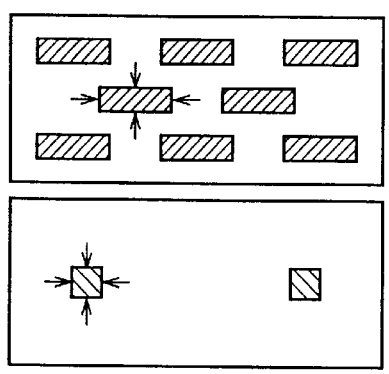
FIG. 4 is a plan view of a representative hole-type element pattern of an actual pattern, corresponding to the monitor mark of FIG. 3.

FIG. 3 is a variation of the first embodiment, showing an example of a hole-type monitor mark. FIG. 4 is a representative of the actual pattern, showing an example of a hole-type element pattern. In FIG. 4, the top part illustrates a memory cell portion and the bottom part illustrates a logic portion. The representative pattern shown in FIG. 4 is provided within the monitor mark shown in FIG. 3. Referring to FIG. 3, high-density array pattern 10 and isolated pattern 11 are provided within an outer frame 7. High-density array pattern 10 corresponds to the portion shown in the top part of FIG. 4 and isolated pattern 11 corresponds to the portion shown in the bottom part of FIG. 4. The portion where the element dimension is to be measured is pointed by arrows. Since two types of patterns are provided, the ability of ensuring the dimension accuracy is enhanced.

is formed wide enough to be visually recognizable through a microscope (at least 10 $\mu$m or more). The monitor mark having the frame pattern shown in FIG. 5 (approximately 1 $\mu$m) is difficult of observation and measurement, while in the monitor mark shown in FIG. 6, the image of the monitor mark can be visually recognizable through the microscope, thereby facilitating its measurement. Specifically, the image of the monitor mark is readily visible even in an automated measurement.

Fourth Embodiment

Figure 7:
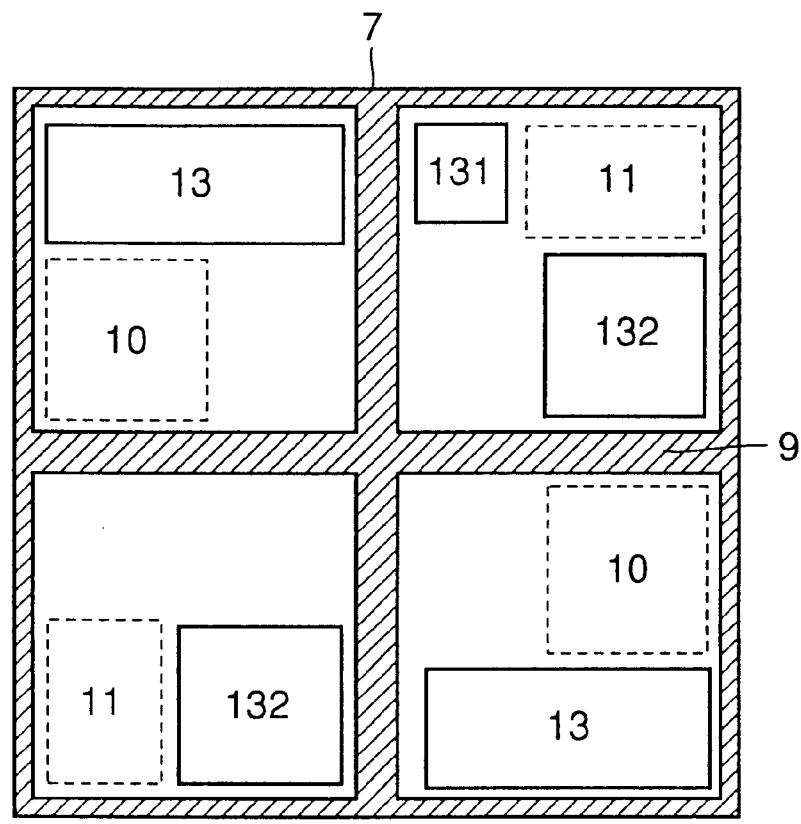
FIG. 7 is a plan view of a monitor mark of the fourth embodiment.

FIG. 7 is a plan view of the monitor mark according to the fourth embodiment. Cross pattern 9, high-density monitor pattern 10 and isolated pattern 11 are provided. A dummy pattern 13 having the same density as high-density pattern 10 is provided in the vicinity of high-density monitor pattern 10. The existence of dummy pattern 13 has the effect that an exposure can uniformly be performed. In the vicinity of isolated pattern 11, a later-described special-use pattern 131 and a dummy pattern 132 having the same density as isolated pattern 11 are provided. The provision of dummy pattern 13 allows for a uniform exposure, and the dimension of the high-density monitor pattern is accurately controlled.

Figure 8:
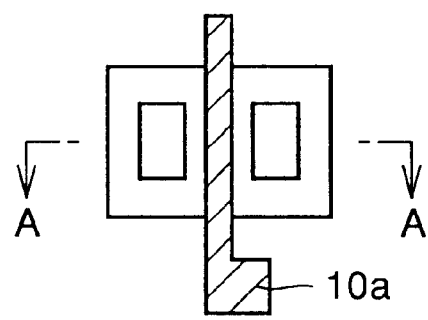
FIG. 8 is a plan view of the first example of a special-use pattern.
Figure 9A:
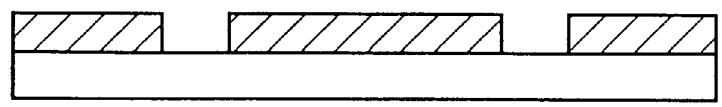
FIGS. 9A to 9C show cross-sectional views taken along lines A—A in FIG. 8.
Figure 9B:
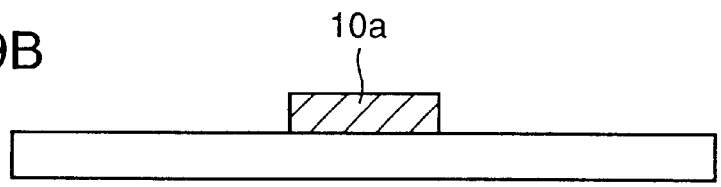
Figure 9C:
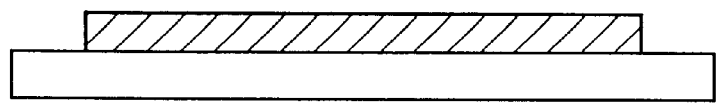

The special-use pattern is now described. FIG. 8 shows the first example of the special-use pattern. FIGS. 9A to 9C illustrate cross-sectional views taken along the line A—A in FIG. 8. FIG. 9A shows an actual pattern for making a contact hole, FIG. 9B shows an actual pattern for forming a gate electrode 10*a*, and FIG. 9C shows an actual pattern for forming element isolation. The pattern shown in FIG. 9C is used in the first step, the pattern shown in FIG. 9B is used in the second step, and the pattern shown in FIG. 9A is used in the third step. FIG. 8 illustrates an example in that a special-use pattern 10*a* for ensuring the pattern dimension of the gate electrode used in the second step is formed within the monitor mark. The present invention also ensures the pattern dimension of the gate electrode.

Figure 10:
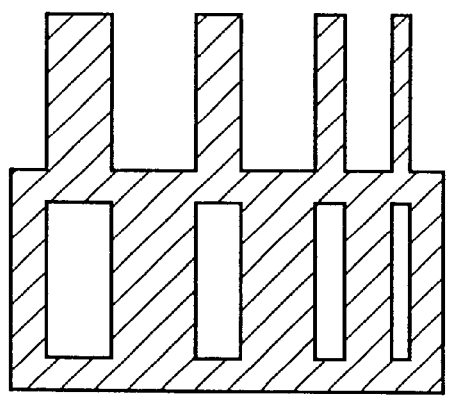
FIG. 10 is a plan view of the second example of the special-use pattern.

FIG. 10 shows the second example of the special-use pattern. This includes various patterns having different widths. By using this special-use pattern, the pattern having a width that cannot be ensured by high-density monitor pattern 10 and isolated pattern 11 can even be ensured in its dimension.

Figure 11:
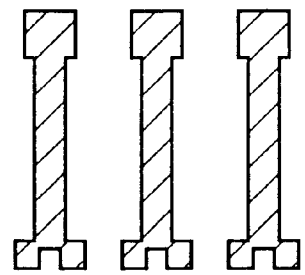
FIG. 11 is a plan view of the third example of the special-use pattern.
Figure 12A:
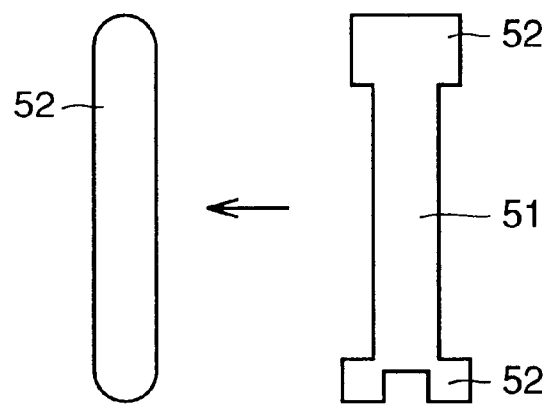
FIGS. 12A and 12B illustrate a functional effect of the special-use pattern shown in FIG. 11.
Figure 12B:
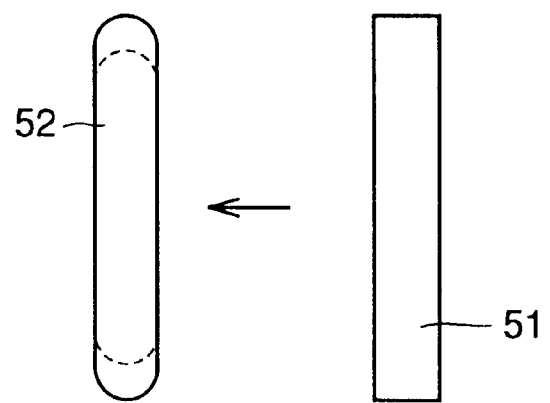

FIG. 11 shows the third example of the special-use pattern. FIGS. 12A and 12B illustrate its function. FIG. 12B shows a conventional example in which a rectangular mask pattern 51 is used, resulting in reduction of the dimension of a pattern 52 for manufacturing of the semiconductor device. Referring to FIG. 12A, on the contrary, a mask having bulged portions 52 at both ends of mask pattern 51 is used, so that the size of pattern 52 will not be reduced in a finished semiconductor device. The special-use pattern shown in FIG. 11 is for ensuring the dimension of such mask pattern 51.

Figure 13:
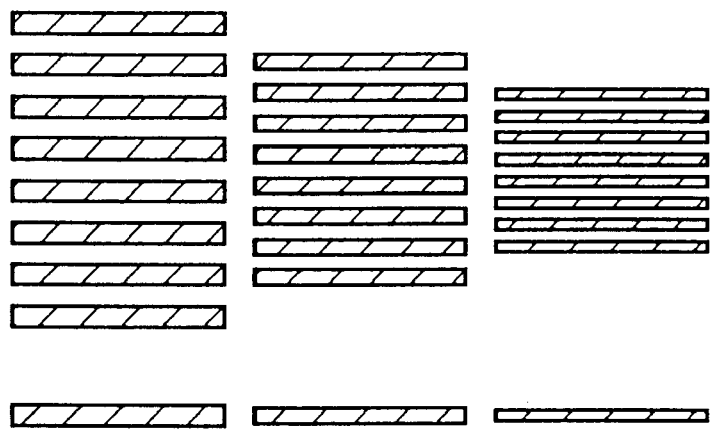
FIG. 13 is a plan view of the fourth example of the special-use pattern.

FIG. 13 shows the fourth example of the special-use pattern. This has the special-use pattern configured with a very small pattern having a size no larger than the design rule of the element pattern. This ensures the dimension of the pattern having smaller size.

Figure 14:
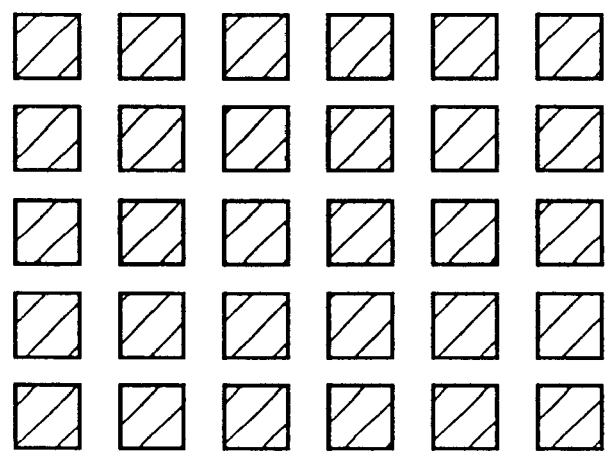
FIG. 14 is a plan view of the fifth example of the special-use pattern.

FIG. 14 shows the fifth example of the special-use pattern, which is for making the pattern density to be uniform.

By arranging the above-described special-use patterns within the monitor mark, the area in the monitor mark can effectively be utilized. Thus, the region in which a semiconductor element pattern is formed can effectively be secured. Further, the arrangement of the dummy pattern allows for the uniform exposure. Therefore, when a semiconductor device is manufactured using this mask, processing accuracy and electric characteristic of the device will be enhanced.

Fifth Embodiment

Figure 15:
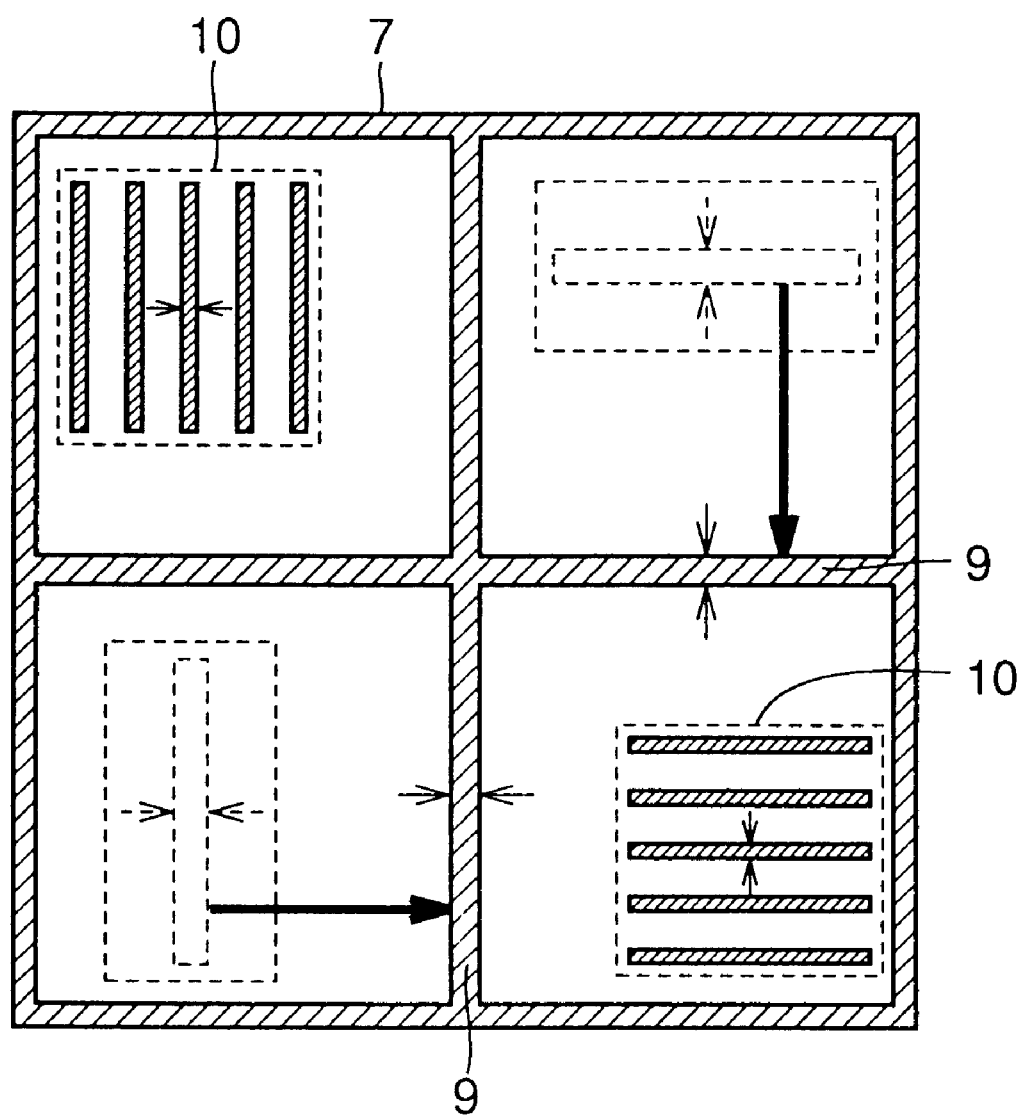
FIG. 15 is a plan view of the monitor mark according to the fifth embodiment.

FIG. 15 is a plan view of the monitor mark according to the fifth embodiment. The monitor mark shown in FIG. 15 is a variation of the monitor mark shown in FIG. 5. Isolated pattern 11 also serves as the arm portion of cross pattern 9. According to the present embodiment, it is not necessary to provide an isolated pattern independently, and the portion in which the isolated pattern was formed can be used for a special-use pattern. Therefore, the monitor mark can be simplified while effectively utilizing the area in the monitor mark.

Sixth Embodiment

FIGS. 16B to 16E are plan view of the monitor mark according to the sixth embodiment. Since the marks shown in FIGS. 16B to 16E are the same as the monitor mark shown in FIG. 5 except for some aspects described below, the same or corresponding portion is denoted by the same reference number and the description thereof will not be repeated.

Figure 16:
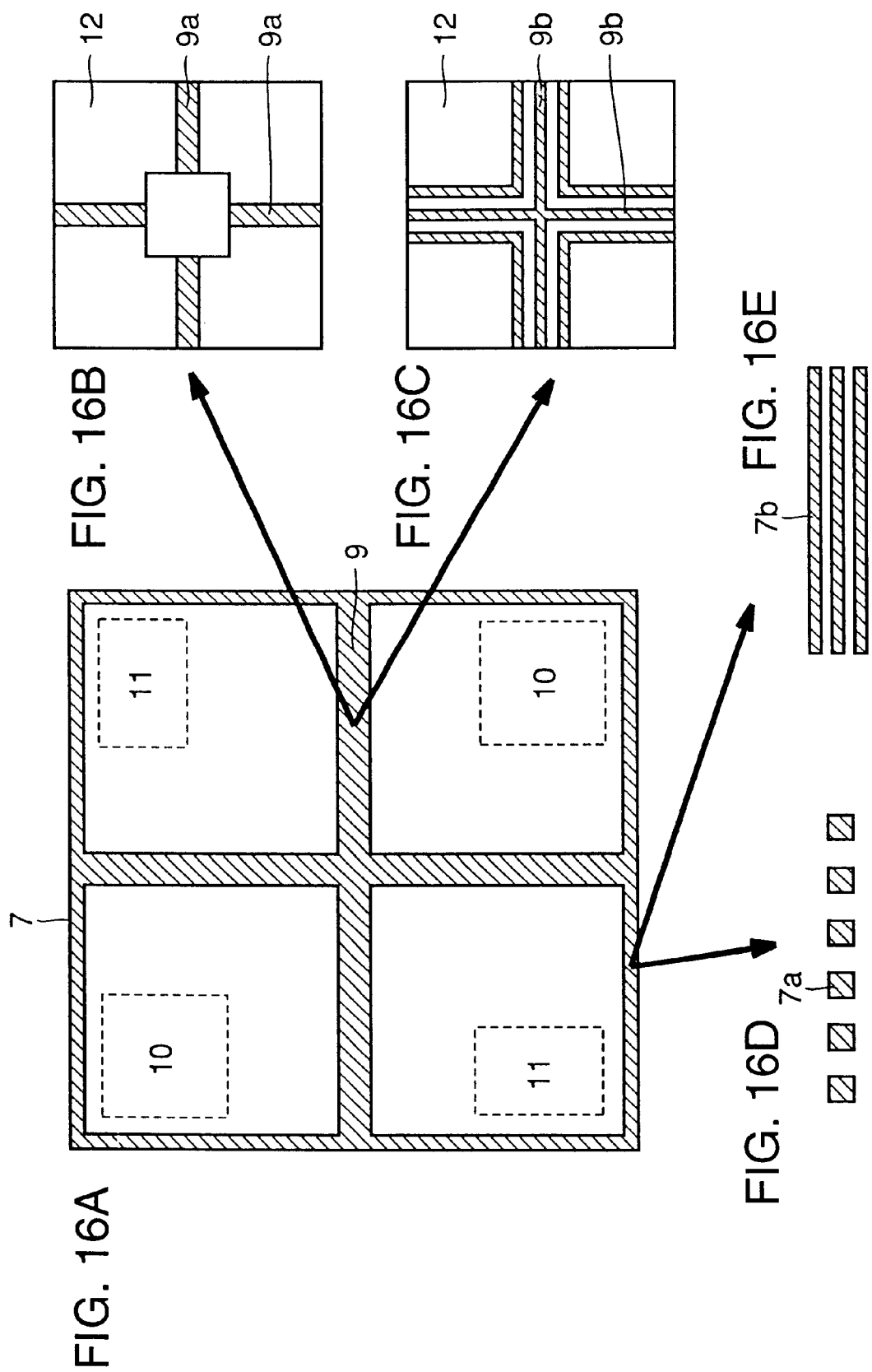
FIGS. 16A to 16E are plan views of the monitor mark according to the sixth embodiment.

The difference between the monitor marks shown in FIGS. 16B to 16E and the monitor mark shown in FIG. 5 is that outer frame pattern 7 is divided into several portions as shown in FIGS. 16D and 16E so as to avoid an over exposure, and the arm portion of cross pattern 9 is also divided into several portions as shown in FIGS. 16B and 16C to avoid the over exposure. The shape and size of the divided portions are selected to match a measurement device. FIG. 16B illustrates a divided cross pattern. FIG. 16C illustrates the cross pattern having line and space. FIG. 16D illustrates the outer frame pattern configured with a pattern of an array of dots. FIG. 16E illustrates the outer frame pattern configured with line and space.

Depending on lithography characteristics on a wafer, the pattern on the wafer (including the resist pattern after lithography) may be degraded in shape while generating dust on the wafer due to the residue of the pattern. However, by using such divided pattern, the degradation of the shape and the generation of the dust can be prevented.

Seventh Embodiment

Figure 17:
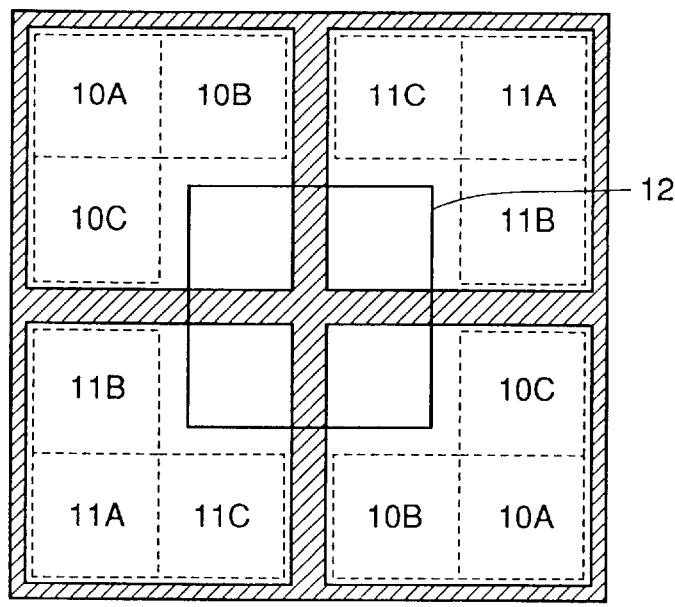
FIG. 17 is a schematic view of a photo-mask pair according to the seventh embodiment.

FIG. 17 is a schematic view of a photo-mask pair according to the seventh embodiment. The photo-mask pair according to the seventh embodiment includes a first photo-mask used in a first step, a second photo-mask used in a second step subsequent to the first step, and a third photo-mask used in a third step subsequent to the second step. FIG. 17 conveniently shows these three photo-masks in one plan view. The first photo-mask includes a high-density array pattern 10A and an isolated pattern 11A. The second photo-mask includes a high-density array pattern 10B and an isolated pattern 11B. The third photo-mask includes a high-density array pattern 10C and an isolated pattern 11C. When the first photo-mask is used in the first step, the second photo-mask is used in the second step and the third photo-mask is used in the third step, these are arranged such that high-density array patterns 10A, 10B and 10C are not overlapped with one another. These masks are also arranged such that isolated patterns 11A, 11B and 11C are not overlapped with one another. Since these patterns do not interfere with one another, formation of a semiconductor device using these photo-mask pair as a mask will advantageously avoid electrical short-circuit.

Figure 18:
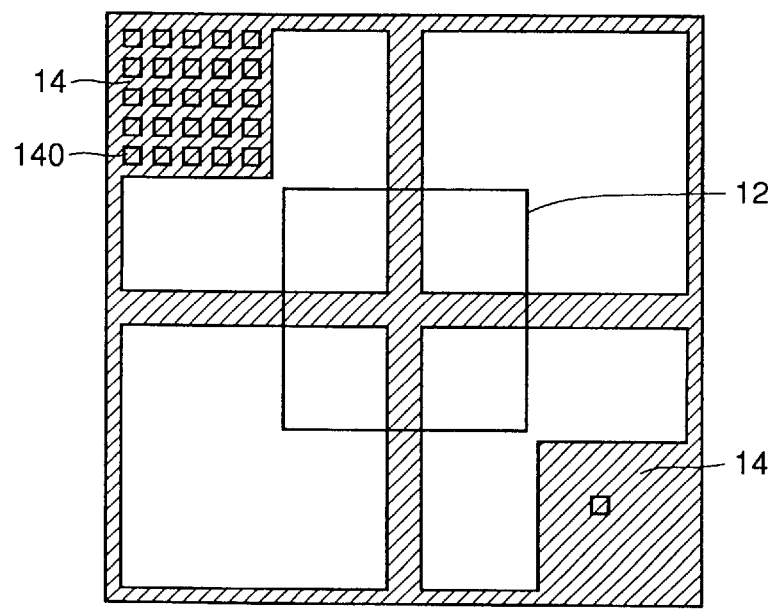
FIG. 18 is a variation of the photo-mask pair according to the seventh embodiment.

FIG. 18 shows another variation of the seventh embodiment. FIG. 18 is a plan view in which the photo-mask pair including the first photo-mask used in the first step and the second photo-mask used in the second step subsequent to the first step are shown overlapped with one another for convenience. In the first monitor mark, a monitor pattern 140 for monitoring the element dimension of a lower layer is provided. The second photo-mask includes a light-shielding pattern 14. When the first photo-mask is used in the first step and the second photo-mask is used in the second step, their positional relationship is such that light-shielding pattern 14 is arranged to cover element dimension monitoring pattern 140. Such a photo-mask pair can prevent the generation of dust.

Figure 19:
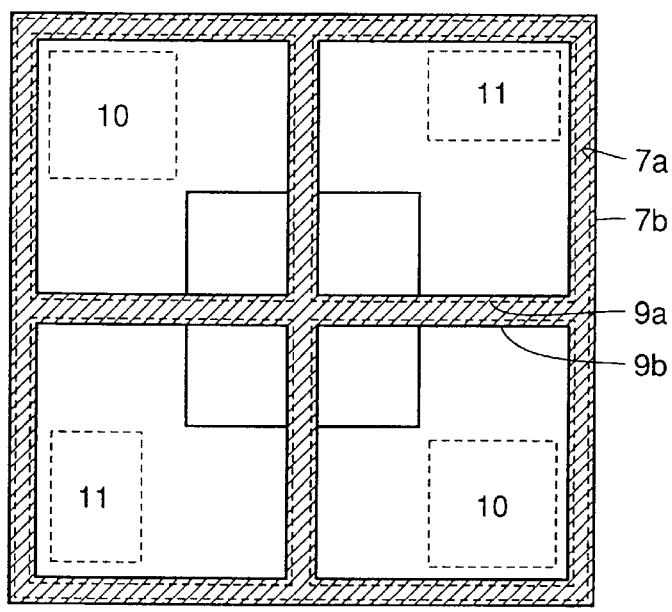
FIG. 19 is an another variation of the photo-mask pair according to the seventh embodiment.

FIG. 19 is a yet another variation of the photo-mask pair according to the seventh embodiment. The photo-mask pair shown in FIG. 19 includes the first photo-mask pair used in the first step and the second photo-mask pair used in the second step. FIG. 19 conveniently shows two photo-masks in one plan view. The first mask includes the first cross pattern 9*a* having a pair of arms crossing each other and the first outer frame pattern 7*a*. The second monitor mark includes the second cross pattern 9*b* having a pair of arms crossing each other and the second outer frame pattern 7*b* provided to enclose the second cross pattern 9*b*. When the first photo-mask is used in the first step and the second photo-mask is used in the second step, the arms of the first cross pattern 9*a* and the second cross pattern 9*b* are selected to have positions and widths with which one will entirely cover the other. The first outer frame pattern 7a and the second outer frame pattern 7b are also selected to have positions and widths with which one will entirely cover the other. The use of the photo-mask shown in FIG. 19 will advantageously prevent the generation of dust.

Eighth Embodiment

Figure 20:
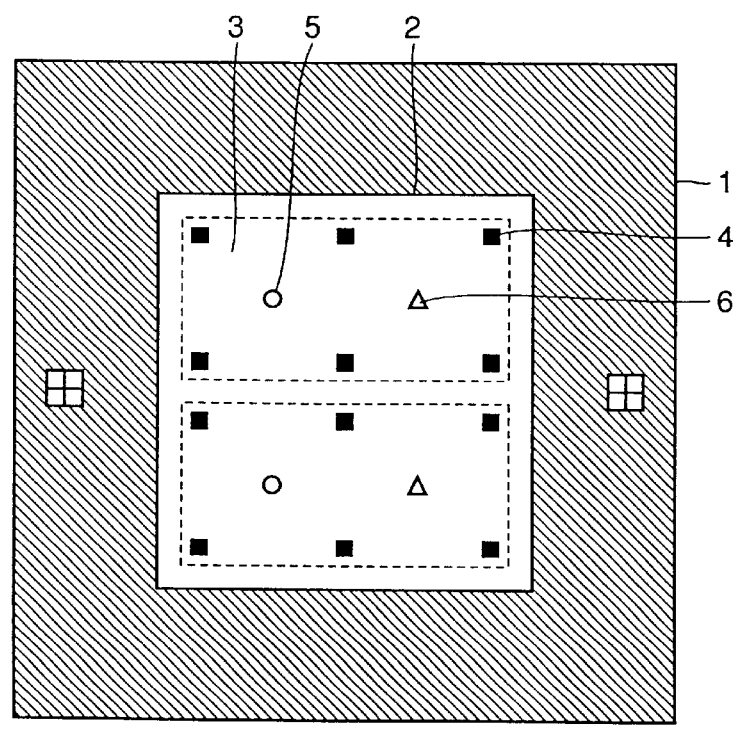
FIG. 20 is a plan view of the photo-mask according to the eighth embodiment.
Figure 21A:
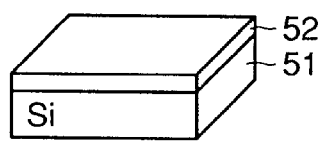
FIGS. 21A to 21F are schematic views of steps for manufacturing a semiconductor device using a conventional photo-mask.
Figure 21D:
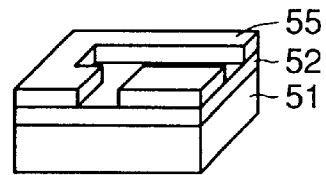
Figure 21B:
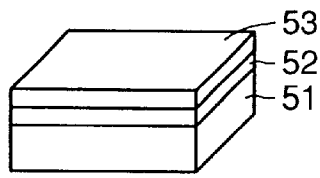
Figure 21E:
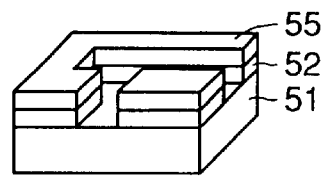
Figure 21C:
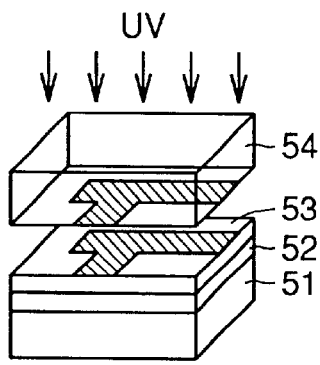
Figure 21F:
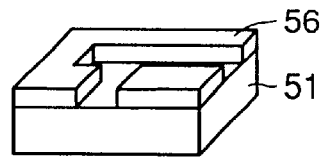
Figure 22:
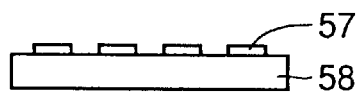
FIG. 22 is a cross-sectional view of the conventional photo-mask.
Figure 23:
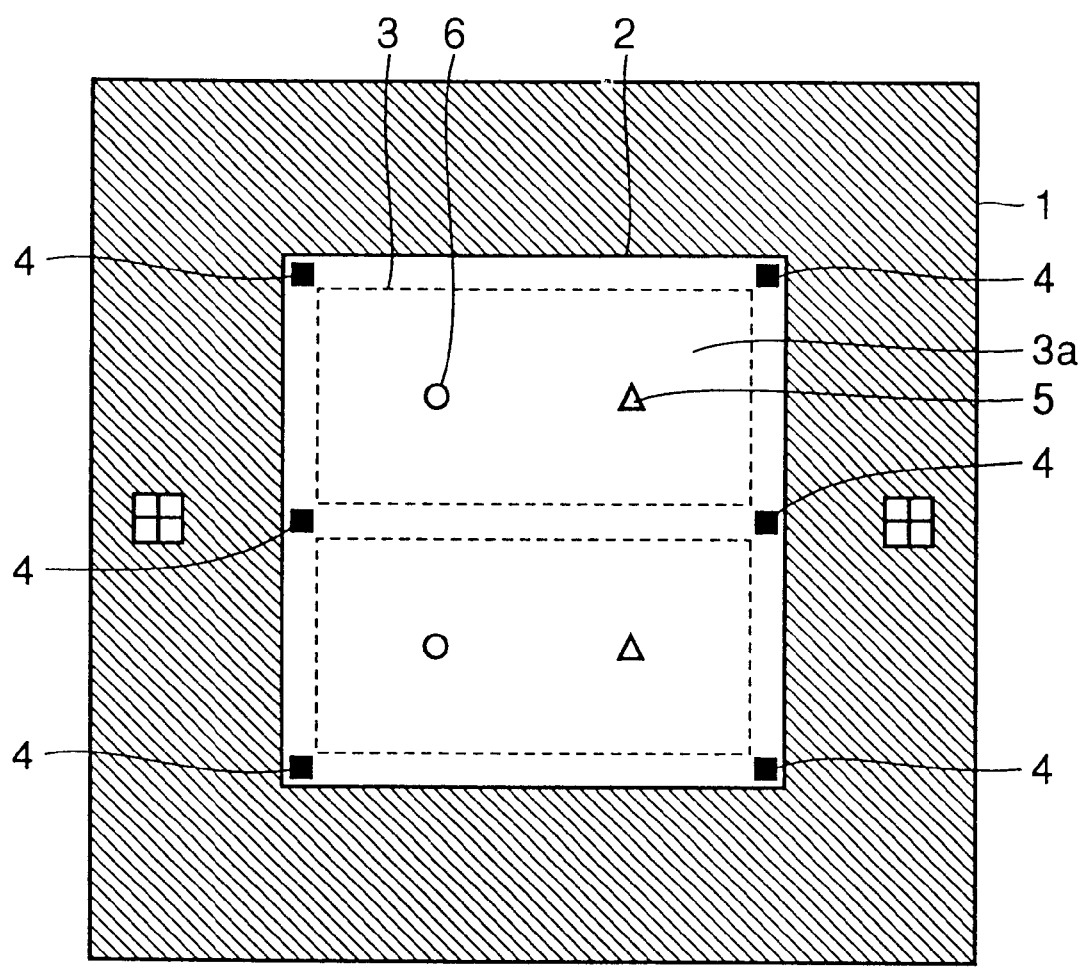
FIG. 23 is a plan view of the conventional photo-mask.
Figure 24A:
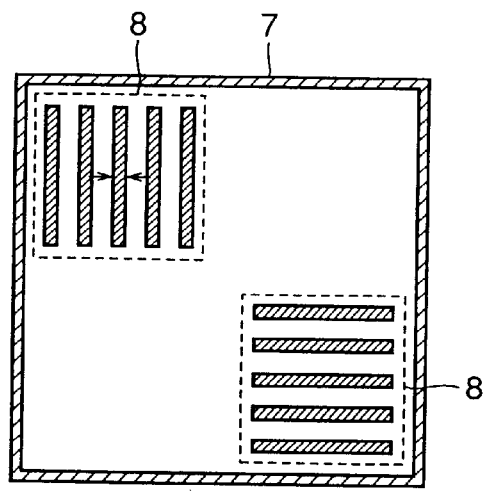
FIGS. 24A and 24B are plan views of the conventional monitor mark.
Figure 24B:
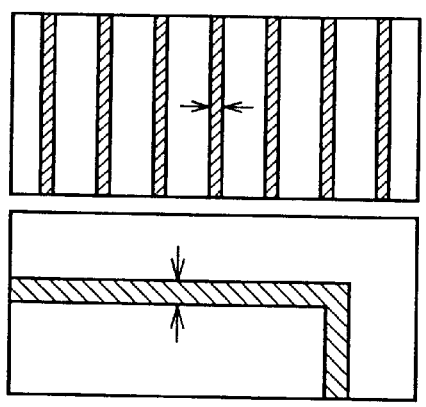
Figure 25A:
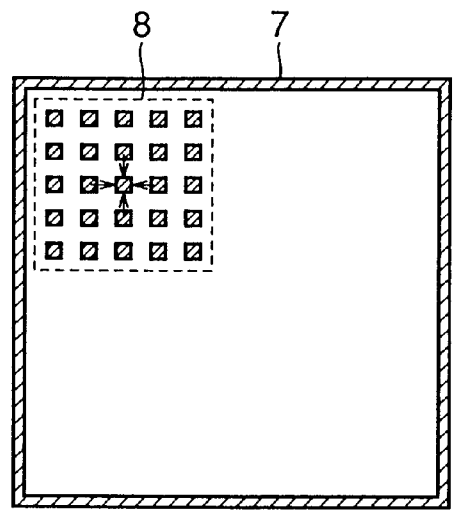
FIGS. 25A and 25B show an another conventional monitor mark.
Figure 25B:
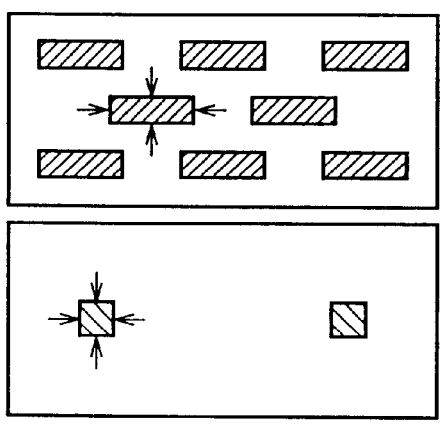
Figure 26:
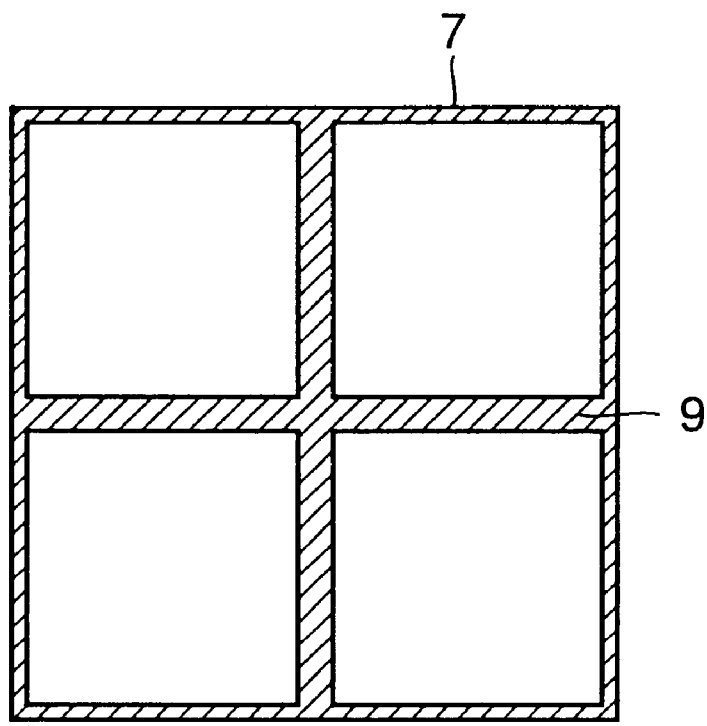
FIG. 26 is a plan view of a monitor mark having a cross pattern for registration accuracy measurement.

FIG. 20 is a plan view of the photo-mask according to the eighth embodiment. Referring to FIG. 20, a photo-mask 1 has a substrate (not shown). A rectangular semiconductor element chip region 3 for forming the patterns of the semiconductor element is provided on the substrate. In semiconductor element chip region 3, a high-density element pattern (e.g. memory cell) 5 and a low-density element pattern (logic portion with low-density) 6 are provided. A plurality of monitor marks 4 for ensuring the dimension of the semiconductor element pattern are provided in semiconductor element chip region. A plurality of monitor marks 4 are provided at four corners of the rectangle and-at the center position of two long sides of the rectangle.

The use of the photo-mask according to the embodiment eliminates the need for measuring the actual element pattern. Since the position of monitor mark 4 is fixed, the pointing of the portion to be measured can be standardized. Thus, the process for measuring the dimension can be simplified.

Ninth Embodiment

By using the photo-mask according to the first to eighth embodiments through the lithography process as shown in FIGS. 21A to 21F, a semiconductor device with enhanced dimension accuracy can be attained.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A photo-mask, comprising:
a substrate;
an actual pattern provided on said substrate; and
a monitor mark provided on said substrate for ensuring dimension of said actual pattern,
said monitor mark being provided with a coarse pattern and a high-density pattern formed to have a density higher than the coarse pattern,
wherein said monitor mark is further provided with a cross pattern for registration accuracy measurement having a pair of arms crossing each other.

2. The photo-mask according to claim 1, wherein said coarse pattern and said high-density pattern are provided remote from a scanning region of said cross pattern.

3. A photo-mask, comprising:
a substrate;
an actual pattern provided on said substrate; and
a monitor mark provided on said substrate for ensuring dimension of said actual pattern,
said monitor mark being provided with a coarse pattern and a high-density pattern formed to have a density higher than the coarse pattern,
wherein said monitor mark includes an outer frame pattern enclosing said coarse pattern and said high-density pattern,
said outer frame pattern being formed wide enough to be visually recognizable through a microscope.

4. A photo-mask, comprising:
a substrate;
an actual pattern provided on said substrate; and
a monitor mark provided on said substrate for ensuring dimension of said actual pattern,
said monitor mark being provided with a coarse pattern and a high-density pattern formed to have a density higher than the coarse pattern,
wherein a first dummy pattern having the same density as said coarse pattern is provided near the coarse pattern, and wherein
a second dummy pattern having the same density as said high-density pattern is provided near the high-density pattern.

5. The photo-mask according to claim 1, wherein a special use pattern having a shape of a pattern for special use is provided near each of said coarse pattern and said high-density pattern.

6. The photo-mask according to claim 1, wherein said coarse pattern is formed as a single pattern, which single pattern also serves as an arm portion of said cross pattern.

7. A photo-mask, comprising
a substrate;
an actual pattern including a hole pattern provided on said substrate; and
a monitor mark provided on said substrate for ensuring dimension of said hole pattern;
said monitor mark being provided with a cross pattern having
a pair of arms crossing each other,
a hole pattern ensuring pattern for ensuring dimension of said hole pattern, and
an outer frame pattern enclosing said cross pattern and said hole pattern ensuring pattern; wherein
said outer frame pattern is divided into a plurality of portions to avoid over exposure; and wherein
said cross pattern has an arm portion divided into a plurality of portions to avoid over exposure.

8. A photo-mask pair including a first photo-mask used in a first step and a second photo-mask used in a second step subsequent to said first step,
said first photo-mask including
a first substrate,
a first actual pattern provided on said first substrate, and
a first monitor mark provided on said first substrate for ensuring dimension of said first actual pattern,
said first monitor mark being provided with a first pattern for monitoring representing the first actual pattern;
said second photo-mask including
a second substrate,
a second actual pattern provided on said second substrate, and
a second monitor mark provided on said second substrate for ensuring dimension of said second actual pattern,
said second monitor mark being provided with a second pattern for monitoring representing said second actual pattern;
said first pattern being provided within said first monitor mark and said second pattern being provided within said second monitor mark so as to avoid overlap of said first pattern and said second pattern when said first photo-mask is used in said first step and said second photo-mask is used in said second step.

9. A photo-mask pair including a first photo-mask used in a first step and a second photo-mask used in a second step subsequent to the first step, said first photo-mask including
  a first substrate,
  a first actual pattern provided on said first substrate, and
  a first monitor mark provided on said first substrate for ensuring dimension of said first actual pattern,
  said first monitor mark including a first pattern for monitoring representing said first actual pattern;
said second photo-mask including
  a second substrate,
  a second actual pattern provided on said second substrate, and
  a second monitor mark provided on said second substrate for ensuring dimension of said second actual pattern,
  said second monitor mark including a light-shielding pattern provided at a position with which said first pattern can be covered when said first photo-mask is used in said first step and said second photo-mask is used in said second step.

10. A photo-mask pair including a first photo-mask used in a first step and a second photo-mask used in a second step subsequent to the first step,
  said first photo-mask including
    a first substrate,
    a first actual pattern provided on said first substrate, and
    a first monitor mark provided on said first substrate for ensuring dimension of said first actual pattern,
    said first monitor mark including
      a first cross pattern having a pair of arms crossing each other, and
      a first outer frame pattern provided to enclose said first cross pattern;
  said second photo-mask including
    a second substrate,
    a second actual pattern provided on said second substrate,
    a second monitor mark provided on said second substrate for ensuring dimension of said first actual pattern,
    said second monitor mark including a second cross pattern having a pair of arms crossing each other and a second outer frame pattern provided to enclose the second cross pattern;
    said arms of said first cross pattern being selected to have positions and widths such that one of a first arm and a second arm entirely covers the other, when said photo-mask is used in said first step and said second photo-mask is used in said second step,
    said first outer frame pattern and said second outer frame pattern being selected to have positions and widths such that one entirely covers the other.

11. A photo-mask, comprising:
  a substrate,
  a semiconductor element chip region of a rectangular shape provided on said substrate to form a pattern of the semiconductor element, and
  a plurality of monitor marks provided on said substrate and within said semiconductor element chip region for ensuring dimension of said semiconductor element pattern,
  said plurality of monitor marks being arranged at four corners of said semiconductor element chip region, near a middle point of two long sides of said semiconductor element chip region and near a center portion of said semiconductor element chip region.

12. The photo-mask according to claim 5, wherein said special use pattern includes a plurality of patterns having different widths.

13. The photo-mask according to claim 5, wherein said special use pattern includes a bar-shape portion and bulged portions at two ends of said bar-shape portion.

14. The photo-mask according to claim 5, wherein said special use pattern has a size no longer than a size in a design rule of said actual pattern.

15. The photo-mask according to claim 5, wherein said special use pattern is positioned within said monitor mark.

* * * * *